United States Patent
Chakrapani

(10) Patent No.: US 11,682,743 B2
(45) Date of Patent: Jun. 20, 2023

(54) SOLAR CELL EMPLOYING PHOSPHORESCENT MATERIALS

(71) Applicant: Rensselaer Polytechnic Institute, Troy, NY (US)

(72) Inventor: Vidhya Chakrapani, Troy, NY (US)

(73) Assignee: Rensselaer Polytechnic Institute, Troy, NY (US)

( * ) Notice: Subject to any disclaimer, the term of this patent is extended or adjusted under 35 U.S.C. 154(b) by 0 days.

(21) Appl. No.: 17/526,108

(22) Filed: Nov. 15, 2021

(65) Prior Publication Data

US 2022/0077341 A1    Mar. 10, 2022

Related U.S. Application Data

(62) Division of application No. 15/547,186, filed on Jul. 28, 2017, now abandoned.

(51) Int. Cl.
| | |
|---|---|
| *H01L 31/055* | (2014.01) |
| *H01G 9/20* | (2006.01) |
| *H01G 9/00* | (2006.01) |
| *H01L 31/18* | (2006.01) |
| *H01L 31/00* | (2006.01) |

(52) U.S. Cl.
CPC ......... *H01L 31/055* (2013.01); *H01G 9/0032* (2013.01); *H01G 9/2022* (2013.01); *H01G 9/2031* (2013.01); *H01L 31/1884* (2013.01); *H01G 9/2013* (2013.01); *Y02E 10/52* (2013.01); *Y02E 10/542* (2013.01)

(58) Field of Classification Search
CPC .. H01L 31/055; H01L 31/1884; H01G 9/2031
See application file for complete search history.

(56) References Cited

U.S. PATENT DOCUMENTS

2014/0076404 A1* 3/2014 Tan ................... B08B 7/0035
204/157.52

OTHER PUBLICATIONS

Shin et al., "Improving the Performance of Dye-sensitized Solar Cells by using the Conversion Luminescence of a Phosphor," Journal of the Korean Physical Society, vol. 65, No. 10, Nov. 2014, pp. 1682-1686 (Year: 2014).*

* cited by examiner

*Primary Examiner* — Angelo Trivisonno
(74) *Attorney, Agent, or Firm* — Murtha Cullina LLP; Anthony P. Gangemi

(57) ABSTRACT

A solar cell device having a solid state light absorber region that incorporates a donor-acceptor particle structure. The particle structure includes acceptor particles that generate a flow of electrons in the solid state light absorber region in response to absorbed photons; and donor particles comprising a phosphorescent material, wherein each donor particle is coupled to a group of acceptor particles, and wherein the phosphorescent material absorbs high energy photons and emits lower energy photons that are absorbed by the acceptor particles.

7 Claims, 3 Drawing Sheets

SOLAR CELL EMPLOYING PHOSPHORESCENT MATERIALS

CROSS REFERENCE TO RELATED APPLICATION(S)

This application is a divisional application of and claims priority benefit of co-pending U.S. patent application Ser. No. 15/547,186, filed Feb. 11, 2016, which claims priority benefit of U.S. Provisional Patent Application No. 62/115,667, filed Feb. 13, 2015, the contents of which are incorporated by reference as if disclosed herein in their entireties.

FIELD

The subject matter of this invention relates to solar cells employing phosphorescent materials, and more particularly to solar cells having a solid state absorber region that integrates phosphor particles with light acceptor particles.

BACKGROUND

Converting solar energy to electricity is the one of the cleanest methods of producing useable energy. Among the various renewable energy technologies available, solar cells hold significant promise. One major drawback of this technology is the lack of flexibility, e.g., solar cells only have the ability to generate power during daylight hours and thus cannot provide an uninterrupted power supply without incorporating additional components. Another drawback is the relatively low efficiency of known devices. Hence, a solar cell with improved efficiency that can generate power during non-daylight hours and/or that enables efficient storage of energy generated during daylight hours is desirable.

SUMMARY

The disclosed solution describes a solar cell device that has improved efficiency in converting light to electrical energy and the ability to output power in the dark after a period of excitation in light. The device incorporates a phosphorescent material within controlled proximity of the light absorber used in solar cells. The phosphorescent material is designed and synthesized so as to match its emission wavelength with the absorption spectrum of the light absorber.

The aforementioned phosphorescent material comprises a donor chromophore (donor particles) that absorbs high energy photons of solar light and emits light of low energy photons over extended rime periods. The transfer of energy from the phosphorescent material to the absorber (acceptor particles) results in the generation of additional electron-hole pairs in the solar cell as compared to those produced in the absence of the phosphorescent material, and leads to an improvement in the efficiency of the solar cell. A device comprising the energy transfer system described herein can be adapted for various solar cell technologies.

A solid state light absorber region is provided that includes a donor-acceptor particle structure having acceptor particles adsorbed on a large surface area of inert nanoparticles that serve as current collectors. Upon excitation, a generation, injection, and flow of electrons in the solid state light absorber region results in response to absorbed photons. Donor particles are provided comprising a phosphorescent material that are coupled to groups of acceptor particles such that the phosphorescent material absorbs high energy photons and emits lower energy photons that are absorbed by the acceptor particles.

In a first aspect, the invention provides a solar cell device, comprising: a solid state light absorber region that includes a donor-acceptor particle structure having: acceptor particles adsorbed on an inert nanoparticles current collector, which causes a flow of electrons in the solid state light absorber region in response to absorbed photons; and donor particles comprising a phosphorescent material, wherein each donor particle is coupled to a group of acceptor particles, and wherein the phosphorescent material absorbs high energy photon and emits lower energy photons that are absorbed by the acceptor particles.

In a second aspect, the invention provides a dye sensitive solar cell (DSSC) device, comprising: a counter electrode; an electrolyte region; a transparent back contact; and a transparent electrode disposed between the electrolyte region and transparent back contact, wherein the transparent electrode includes a donor-acceptor particle structure having: acceptor particles adsorbed on an inert nanoparticles current collector, which upon absorption of photons, results in a flow of free electrons in the acceptor particles, injection of electrons into the inert nanoparticles current collector, and transport of injected electrons by the inert nanoparticles current collector to the transparent back contact; and donor particles comprising a phosphorescent material, wherein each donor particle is coupled to a group of acceptor particles, and wherein the phosphorescent material absorbs high energy photons and emits lower energy photons that are absorbed by the acceptor particles.

In a third aspect, the invention provides a method of forming a dye sensitive solar cell (DSSC) device, comprising: providing a first and a second transparent back contact; forming a transparent electrode on the first transparent back contact wherein the transparent electrode includes a donor-acceptor particle structure having: acceptor particles adsorbed on an inert nanoparticles current collector; and donor particles comprising a phosphorescent material, wherein each donor particle is coupled to a group of acceptor particles, and wherein the phosphorescent material absorbs high energy photons and emits lower energy photons that are absorbed by the acceptor particles; forming a counter electrode on the second transparent back contact; and forming an electrolyte region between the counter electrode and transparent electrode; wherein the transparent electrode forms a light absorption region, which upon absorption of photons results in a flow of free electrons in the acceptor particles, injection of electrons into the inert nanoparticles current collector and transport of injected electrons by the inert nanoparticles current collector to the first transparent back contact.

BRIEF DESCRIPTION OF THE DRAWINGS

These and other features of this invention will be more readily understood from the following detailed description of the various aspects of the invention taken in conjunction with the accompanying drawings in which.

The drawings are not necessarily to scale. The drawings are merely schematic representations, not intended to portray specific parameters of the invention. The drawings are intended to depict only typical embodiments of the invention, and therefore should not be considered as limiting the scope of the invention. In the drawings, like numbering represents like elements.

DETAILED DESCRIPTION

A solar cell device and associated method for forming the device are disclosed having a solid state light absorber region or chromophore that includes coated phosphor "donor" particles placed in close proximity to associated "acceptor" particles. While both types of particles act as chromophores (light absorbers), the donor particles include a phosphorescent material that absorbs high energy photons of solar light and emits light of low energy photons over extended time periods. The phosphorescent material is selected so as to enable spectral overlap of its emission wavelength with the absorption spectrum of the acceptor particles. The transfer of energy from the phosphorescent material to the acceptor particles results in the generation of additional electron-hole pairs in the absorber chromophore as compared to those produced in the absence of the phosphorescent material, and leads to the improvement in the efficiency of the solar cell. In addition, because the phosphorescent material continues to emit low energy photons even after the removal of an excitation light source (e.g., the sun in the present case), the resulting solar cell device has the ability to output power in the dark after a period of excitation in light.

In an illustrative embodiment, the donor-acceptor particle structure is implemented in a solid state form with inorganic phosphor particles having a very high phosphorescence efficiency in which the distance between each donor particle and associated acceptor particles is carefully controlled to optimize energy transfer between the two. The use of inorganic phosphorescent materials allows emission of radiation for many hours in darkened conditions, which can be used to power a solar cell device in the absence of light. Experimental results in a dye sensitive solar cell application show approximately a 60% improvement in the solar cell device's efficiency under illumination using simulated sunlight and 300 times improvement in the dark. Because the energy transfer is achieved in a solid state, the present approach is not restricted to organic phosphors embedded in liquid electrolytes, such as photoelectrochemical (PEC) solar cells, but can instead be adapted for a wide variety of known solar cells.

Figure 1:
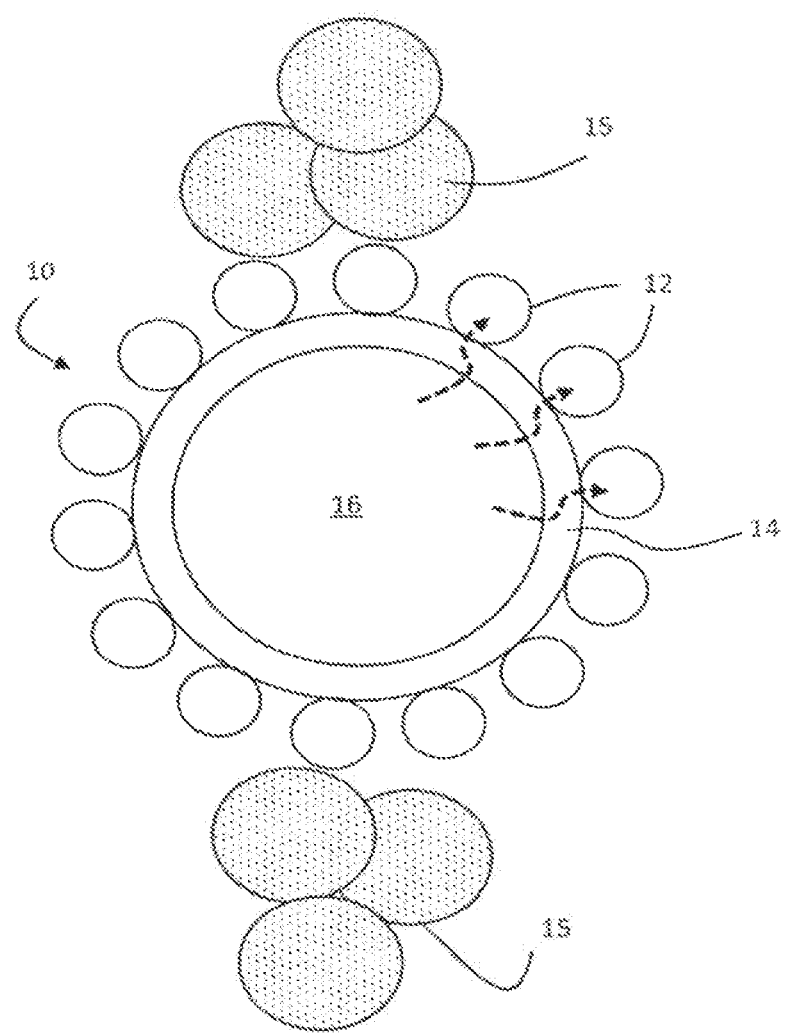
FIG. 1 depicts a donor-acceptor particle structure according to embodiments.

Referring now to the drawings, FIG. 1 depicts a donor-acceptor particle structure 10 that includes a phosphor (donor) particle 16 having a coating or spacer 14 coupled to a group of acceptor particles 12. The acceptor particles 12 are adsorbed on inert nanoparticles that serve as current collectors, the structure generally being referred to as an "inert nanoparticles current collector" 15. When incorporated into a solar cell device, the phosphorescent material that makes up the phosphor particle 16 is excited by high energy photons of sunlight, which is transferred to the acceptor particles 12 to both enhance efficiency during lighted conditions and allow for extended periods of use (e.g., several hours) in darkened conditions.

Figure 2:
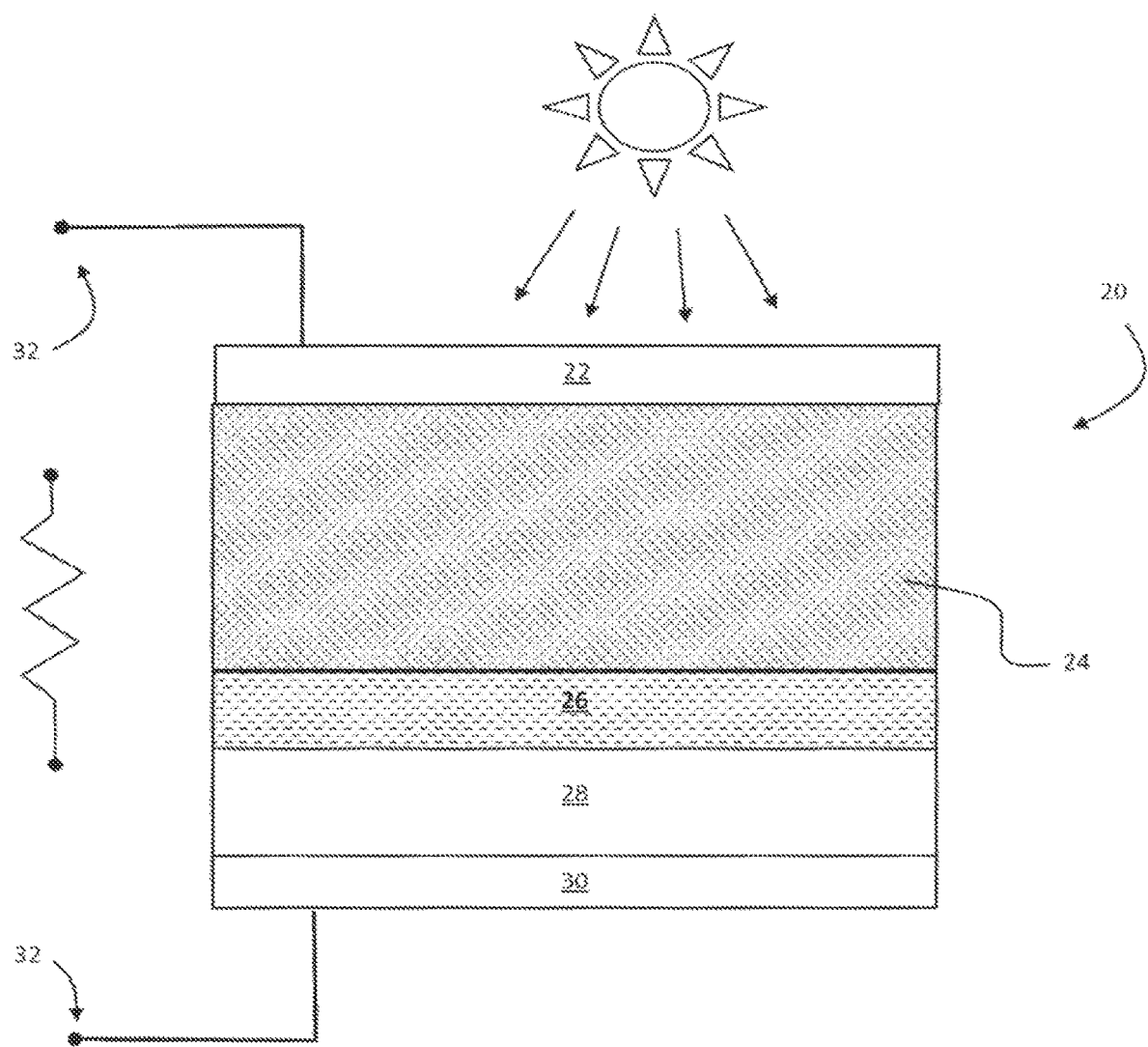
FIG. 2 depicts a dye sensitive solar cell according to embodiments.

FIG. 2 depicts an illustrative embodiment of a dye sensitized solar cell (DSSC) device 20 that employs the above-mentioned donor-acceptor particle structure 10. Device 20 generally includes a first transparent back contact 22, a top electrode 24 (i.e., anode) that incorporates the donor-acceptor particle structure 10 and inert nanoparticles current collector 15 to form a solid state light absorbing region, an electrolyte 26, a counter electrode 28 (cathode) and a second transparent back contact 30. The illustrative solar cell device 20 is generally implemented using a standard dye sensitized solar cell (DSSC) architecture, with the additional phosphor material incorporated with the acceptor particles in the top electrode 24.

In the illustrative DSSC embodiment 20, phosphor particles 16 may for example comprise $SrAl_2O_4$ coated with a thin layer of polycrystalline $TiO_2$ film that forms the spacer 14. Acceptor particles 12 may for example be comprised of an absorber such as dye or quantum dot material adsorbed on a $TiO_2$ nanoparticle current collector. The $TiO_2$ film (i.e., spacer 14) prevents the direct contact of the phosphor material 16 with the electrolyte 26, thus preventing the quenching of phosphorescent signals by the iodide/triiodide or other redox couples. The spacer 14 also serves as a barrier against direct charge transfer between the phosphor particle 16 and the acceptor particles 12, and serves as an electrical conduit for injected electrons from the excited dye to the back contact 30 of the solar cell. $TiO_2$ is transparent to the visible light (e.g., $\lambda=520$ nm) emitted by the phosphor particles 16. In one illustrative embodiment, the thickness of the $TiO_2$ spacer may be in the range of 8-10 nm.

DSSC device 20 generally includes a solid dye structure formed within the top electrode 24 for catching photons of incoming light, which convert the energy into excited electrons. The excited electrons are then injected into a conduction band of the $TiO_2$ nanoparticles in the electrode 24, and conducted away (upward In FIG. 2) to the first transparent back contact 22 by the layer's $TiO_2$ nanoparticles current collector 15 (FIG. 1). Electrolyte 26 closes the circuit 32 allowing the electrons to return to the dye within electrode layer 24. The movement of the electrons through the electrical circuit 32 can be used to run electrical devices and thus produce usable work. By incorporating the donor-acceptor particle structure 10 into the top electrode 24, the number of electron hole pairs is increased, thus improving efficiency. Furthermore, because the phosphorescent material continues to emit energy for many hours after excitation, the device will continue to output electricity in darkened conditions.

Although described in a DSSC embodiment, the described donor-acceptor particle structure 10 may likewise be incorporated into other types of devices, such as quantum dot solar cells, polymer solar cells, and thin film solar cells.

In the case of a DSSC device, the following illustrative fabrication process may be utilized, with reference to FIGS. 1 and 2. First, a light emitting phosphor 16 is selected, such as a green $(Sr_{0.95}Eu_{0.02}Dy_{0.03}Al_2O_4)$ or blue $(Sr_{2.95}Eu_{0.03}Dy_{0.07}Al_4O_{11})$ emitting phosphor having particle diameters of approximately 230 mesh and 300 mesh respectively. Next, the phosphor particles 16 are coated with a film (i.e., spacer) 14. This may for example be done by repeatedly spraying a mixture of 0.1 M titanium (IV) isopropoxide and 1.2 M acetylacetonate in ethanol on the phosphor particles 16 dispersed on a silicon wafer maintained at 400° C. After the deposition, the particles may be annealed at 500° C. for 30 minutes to remove trace organics. The thickness of the coating may be in range of 8-10 nm, which may he accomplished with 40 deposition cycles.

$TiO_2$ nanoparticles may be prepared as a transparent $TiO_2$ paste with hydrothermal synthesis used titanium (IV) isopropoxide as a precursor. For example, the procedure may utilize the drop wise addition of 3.7 mL of the precursor to a breaker containing a mixture of 1 mL of 2-propanol, 8 mL of acetic acid, and 25 mL distilled water kept over an ice bath.

The mixture can then be heated at 80° C. for 25 minutes. The entire contents can then be transferred to an autoclave and heated to a temperature of 250° C. for approximately 13 hours. The resulting particles are repeatedly washed, with distilled water, centrifuged, and finally suspended in ethanol until further use. Particles obtained by this procedure comprise pure anatase phase of $TiO_2$ with an average particles size of ~20 nm. Scattering $TiO_2$ nanoparticles may be prepared, by dispersing 10 grams of P25 (Degussa) powder in 30 mL of ethanol. The mixture may then be sonicated for 30 minutes.

The top electrode 24 may be fabricated as follows. First, a fluorine-doped tin oxide coated glass (FTO substrate—i.e., first transparent back contact 22) is coated with a transparent blocking layer of $TiO_2$, such as the provided by SOLARONIX®, and annealed in a furnace at 500° C. for 30 minutes, which is then followed with a deposition of thick transparent $TiO_2$ nanoparticles. The film is then dried and coated with 150 μm of paste containing scattering $TiO_2$ nanoparticles and $TiO_2$ coated $SrAl_2O_4$. The volumetric ratio of $TiO_2$ to phosphor particles may for example be in the range of approximately 10:1. The film is then annealed at 500° C. for 60 minutes to achieve a total film thickness of approximately 100 microns. Before sensitization with ruthenium dye (e.g., N719, SIGMA ALDRICH®), the substrate is immersed in 0.02M $TiCl_4$ solution for 10 minutes, and annealed again at 450° C. for 60 minutes. The resulting substrate is then immersed in a 0.5 mM N719 dye dissolved in 1:1 (v/v) ratio of acetonitrile and tert-butyl alcohol at 4° C. to form the top electrode 24.

A platinum counter electrode 28 may be prepared by applying a thin coating of chloroplatinic acid on a second FTO substrate (i.e., second transparent back contact 30), followed by annealing at 500° C. for 1 hour.

The electrodes 24, 28 may be assembled using a 200 μm-thick hot-melt film (Surlyn 1702, SOLARONIX®) as spacer between the transparent electrode 24 and counter electrode 28. An electrolyte 26, e.g., consisting of 0.6 M PMII, 0.05 M $I_2$, 0.05M tertbutyl pyridine (0.04 M) and 0.025M guanidinium thiocyanate in 4:1 (v/v) ratio of acetonitrile and valeronitrile, may be injected through a small, predrilled hole in the counter electrode 28.

Figure 3:
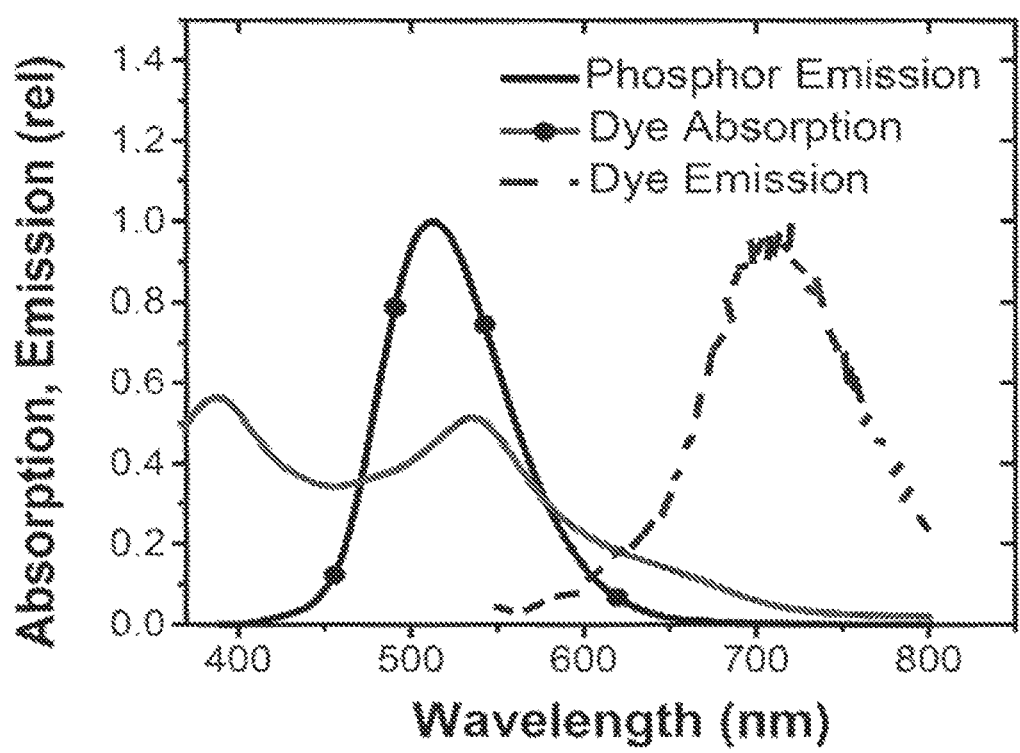
FIG. 3 depicts a graph showing spectral matching of donor and acceptor particles according to embodiments.

As noted herein, the emission spectra of the donor particles should be selected to overlap the absorption spectra of the acceptor particle to maximize efficiency of the device. FIG. 3, for example, shows the absorption and emission spectra of N719 dye dissolved in tert-butyl alcohol along with the emission spectra of $SrAl_2O_4$ (dispersed on a copper foil) recorded at room temperature at an excitation wavelength of 373 nm. The absorption spectrum of N719 dye shows an absorption peak at 520 nm and has a good spectral overlap with the emission range of $SrAl_2O_4$, which is necessary for efficient excitation energy transfer. $SrAl_2O_4$ has a broad excitation spectrum from 460-250 nm, and thus can be excited by solar radiation. The phosphor exhibits a broad band photoluminescence (PL) with maximum intensity occurring at 520 nm.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A method of forming a dye sensitive solar cell (DSSC) device, comprising:
    providing a transparent front contact;
    providing a transparent back contact;
    forming donor particles that are each coated with a spacer layer, the forming comprising:
        providing phosphorescent particles dispersed on a silicon wafer maintained at 400° C.;
        spraying a mixture of 0.1 M titanium (IV) isopropoxide and 1.2 M acetylacetonate in ethanol on the phosphorescent particles;
        annealing the phosphorescent particles at 500° C. for 30 minutes; and
        repeating the spraying and annealing steps for a total of 40 cycles such that each phosphorescent particle is coated with the spacer layer having a thickness in the range of 8 nm to 10 nm;
    forming a transparent electrode on the transparent front contact, the forming comprising:
        providing an inert nanoparticles current collector;
        mixing the donor particles with the inert nanoparticles current collector to form a transparent paste;
        applying the transparent paste to a surface of the transparent front contact to form a transparent film;
        annealing the transparent film at 500° C. for 60 minutes such that the transparent film has a thickness of approximately 100 microns;
        immersing the transparent front contact in 0.02M $TiCl_4$ solution for 10 minutes;
        annealing the transparent front contact at 450° C. for 60 minutes; and
        immersing the transparent front contact in an acceptor particles dye such that the acceptor particles are adsorbed on the inert nanoparticles current collector;
        wherein the transparent electrode includes a donor-acceptor particle structure
        wherein each donor particle is coupled to a group of acceptor particles, and wherein the phosphorescent material absorbs high energy photons and emits lower energy photons that are absorbed by the acceptor particles;
    forming a counter electrode on the transparent back contact; and
    forming an electrolyte region between the counter electrode and transparent electrode;
    wherein the transparent electrode forms a light absorption region, which upon absorption of photons results in a flow of free electrons in the acceptor particles, injection of electrons into the inert nanoparticles current collector, and transport of injected electrons by the inert nanoparticles current collector to the transparent front contact.

2. The method of claim 1, wherein the acceptor particles dye comprises a ruthenium dye and the inert nanoparticles current collector comprises pure anatase phase of $TiO_2$ nanoparticles having an average particle size of 20 nm.

3. The method of claim 1, wherein the spacer layer comprises $TiO_2$.

4. The method of claim 1, wherein a volumetric ratio of acceptor particles to donor particles is approximately 10:1.

5. The method of claim 1, wherein the phosphorescent particles comprise green light emitting phosphorescent particles having a particle diameter of approximately 230 mesh.

6. The method of claim 1, wherein the phosphorescent particles comprise blue light emitting phosphorescent particles having a particle diameter of approximately 300 mesh.

7. The method of claim 1, wherein forming the electrolyte region comprises injecting an electrolyte through the counter electrode.

* * * * *